US012682957B2

(12) United States Patent
Goh et al.

(10) Patent No.: US 12,682,957 B2
(45) Date of Patent: Jul. 14, 2026

(54) RESAMPLE START VOLTAGE FOR CALIBRATION IN A PROGRAM OPERATION IMPROVEMENT

(71) Applicant: Micron Technology, Inc., Boise, ID (US)

(72) Inventors: Edric Goh, Singapore (SG); Dheeraj Srinivasan, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 18/733,377

(22) Filed: Jun. 4, 2024

(65) Prior Publication Data

US 2024/0412787 A1     Dec. 12, 2024

Related U.S. Application Data

(60) Provisional application No. 63/472,550, filed on Jun. 12, 2023.

(51) Int. Cl.
    *G11C 16/10*     (2006.01)
    *G11C 16/26*     (2006.01)
    *G11C 16/34*     (2006.01)

(52) U.S. Cl.
    CPC ............ *G11C 16/102* (2013.01); *G11C 16/26* (2013.01); *G11C 16/3404* (2013.01); *G11C 2207/2254* (2013.01)

(58) Field of Classification Search
CPC ... G11C 16/102; G11C 16/26; G11C 16/3404; G11C 2207/2254; G11C 16/0483
See application file for complete search history.

(56) References Cited

U.S. PATENT DOCUMENTS

| | | | |
|---|---|---|---|
| 2011/0007562 A1* | 1/2011 | Yip | G11C 11/5628 |
| | | | 365/185.18 |
| 2024/0168642 A1* | 5/2024 | Wan | G11C 16/0483 |

\* cited by examiner

*Primary Examiner* — Xiaochun L Chen
(74) *Attorney, Agent, or Firm* — Lowenstein Sandler LLP

(57) ABSTRACT

A memory device can include a memory array including a plurality of memory cells coupled to a control logic. The control logic is to initiate a program operation on one or more memory cells of a first segment of the memory array, wherein the program operation comprises a first calibration phase. The control logic can also read a first stored value corresponding to a first voltage applied during a second calibration phase for a second segment of the memory array, the second calibration phase before the first calibration phase. The control logic can further read a second stored value corresponding to an offset value associated with the first voltage. Additionally, the control logic can determine a second voltage for application during the calibration phase responsive to reading the first stored value and the second stored value.

20 Claims, 7 Drawing Sheets

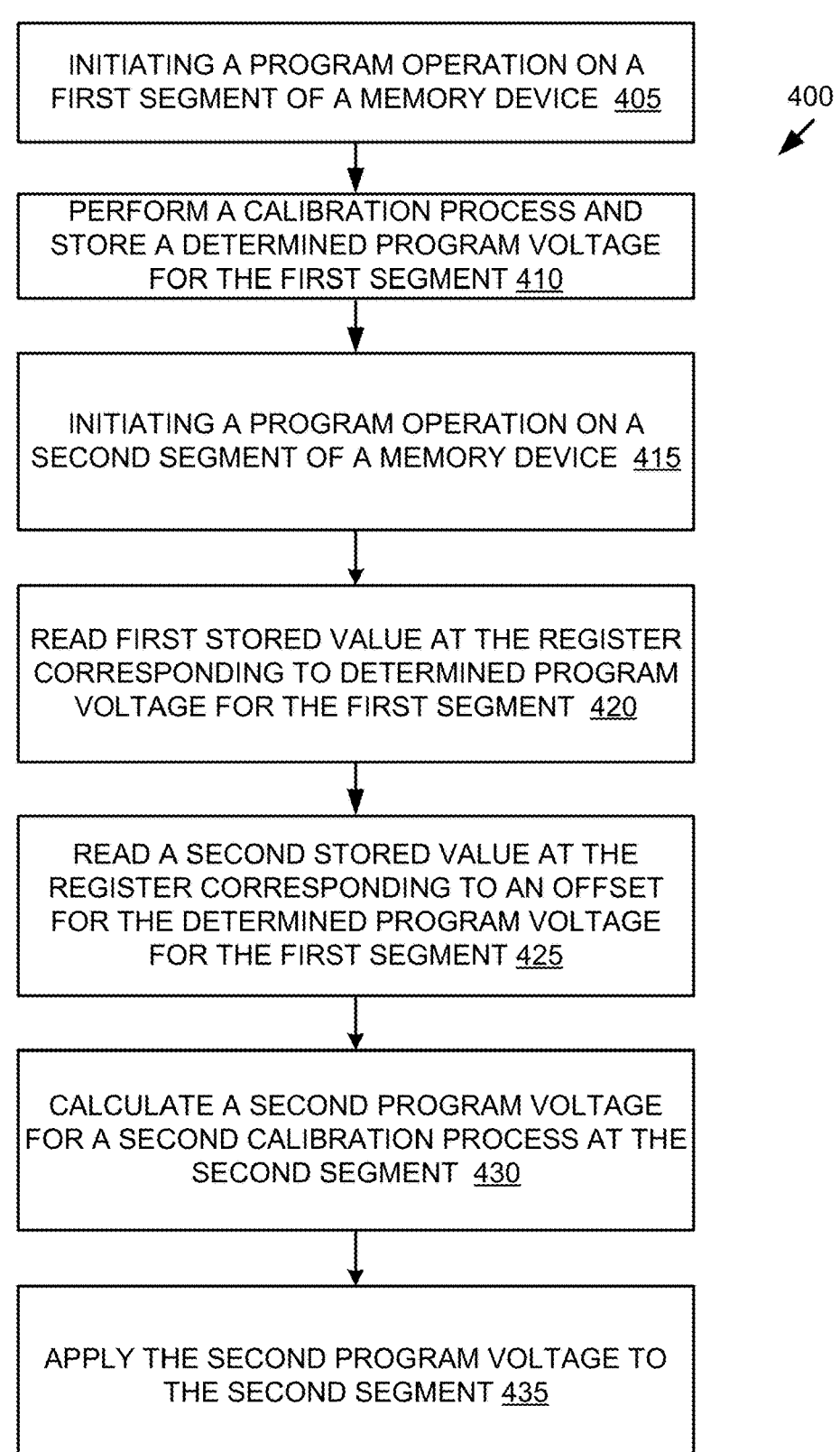

INITIATING A PROGRAM OPERATION ON A FIRST SEGMENT OF A MEMORY DEVICE  405

PERFORM A CALIBRATION PROCESS AND STORE A DETERMINED PROGRAM VOLTAGE FOR THE FIRST SEGMENT 410

INITIATING A PROGRAM OPERATION ON A SECOND SEGMENT OF A MEMORY DEVICE 415

READ FIRST STORED VALUE AT THE REGISTER CORRESPONDING TO DETERMINED PROGRAM VOLTAGE FOR THE FIRST SEGMENT 420

READ A SECOND STORED VALUE AT THE REGISTER CORRESPONDING TO AN OFFSET FOR THE DETERMINED PROGRAM VOLTAGE FOR THE FIRST SEGMENT 425

CALCULATE A SECOND PROGRAM VOLTAGE FOR A SECOND CALIBRATION PROCESS AT THE SECOND SEGMENT 430

APPLY THE SECOND PROGRAM VOLTAGE TO THE SECOND SEGMENT 435

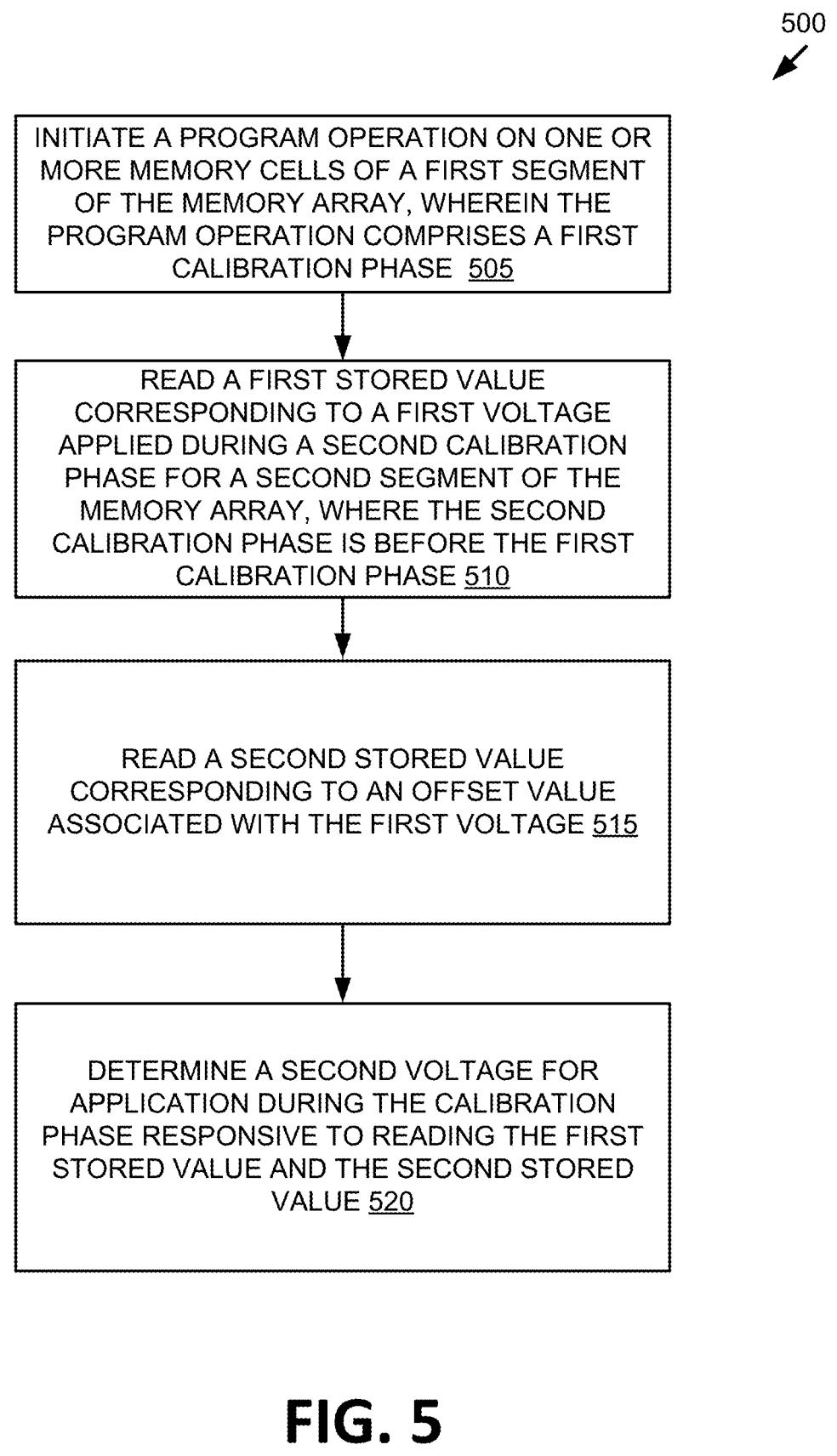

INITIATE A PROGRAM OPERATION ON ONE OR MORE MEMORY CELLS OF A FIRST SEGMENT OF THE MEMORY ARRAY, WHEREIN THE PROGRAM OPERATION COMPRISES A FIRST CALIBRATION PHASE 505

READ A FIRST STORED VALUE CORRESPONDING TO A FIRST VOLTAGE APPLIED DURING A SECOND CALIBRATION PHASE FOR A SECOND SEGMENT OF THE MEMORY ARRAY, WHERE THE SECOND CALIBRATION PHASE IS BEFORE THE FIRST CALIBRATION PHASE 510

READ A SECOND STORED VALUE CORRESPONDING TO AN OFFSET VALUE ASSOCIATED WITH THE FIRST VOLTAGE 515

DETERMINE A SECOND VOLTAGE FOR APPLICATION DURING THE CALIBRATION PHASE RESPONSIVE TO READING THE FIRST STORED VALUE AND THE SECOND STORED VALUE 520

FIG. 5

RESAMPLE START VOLTAGE FOR CALIBRATION IN A PROGRAM OPERATION IMPROVEMENT

RELATED APPLICATIONS

This application claims the benefit of U.S. Provisional Application No. 63/472,550, filed Jun. 12, 2023, the entire contents of which are hereby incorporated by reference herein.

TECHNICAL FIELD

Embodiments of the disclosure relate generally to memory sub-systems, and more specifically, relate to a utilizing a previously used resample voltage for calibration in a program operation.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 is a flow diagram of an example method of utilizing a previously stored resample start voltage for calibration in a program operation, in accordance with some embodiments of the present disclosure.

FIG. 5 is a flow diagram of an example method of utilizing a previously stored resample start voltage for calibration in a program operation, in accordance with some embodiments of the present disclosure.

DETAILED DESCRIPTION

Figure 1A:
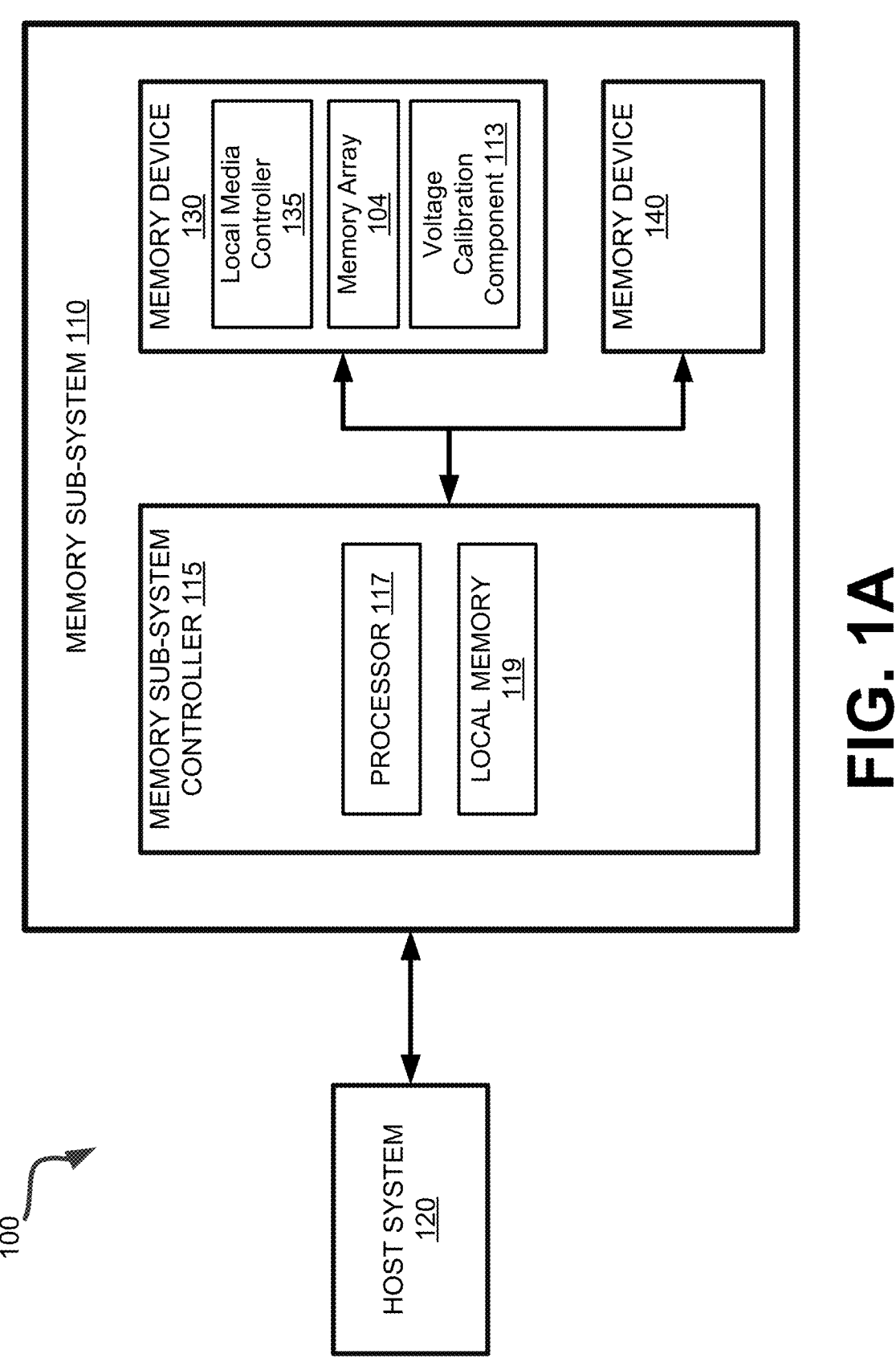
FIG. 1A illustrates an example computing system that includes a memory sub-system in accordance with some embodiments of the present disclosure.

Aspects of the present disclosure are directed to using a previously stored resampling (e.g., calibration) voltage during a program operation. A memory sub-system can be a storage device, a memory module, or a combination of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bit lines) and rows (also hereinafter referred to as wordlines). A wordline can refer to one or more rows of memory cells of a memory device that are used with one or more bit lines to generate the address of each of the memory cells. The intersection of a bit line and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. Each data block can include a number of sub-blocks, where each sub-block is defined by an associated pillar (e.g., a vertical conductive trace) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "wordlines," often fabricated in common with the memory cells, so as to form an array of strings in a block of memory. The compact nature of certain non-volatile memory devices, such as 3D flash NAND memory, means wordlines are common to many memory cells within a block of memory.

During a program operation or an erase operation on a non-volatile memory device, a selected memory cell(s) can be programmed or erased with the application of a voltage to a selected wordline. For example, a controller of the non-volatile memory device can cause a pulse to be applied to a wordline to program a memory cell associated with that wordline to a first logic state (e.g., to a first voltage level). But due to natural variations in the manufacturing process, memory cells in different segments (e.g., different blocks or different decks of the memory array) of the non-volatile memory device can require a different program voltage to be applied in order to be programmed to the first logic state. For example, a memory cell in a first segment can be programmed to the first logic state by applying a first program voltage and a memory cell in a second segment can be programmed to the first logic state by applying a second program voltage, different than the first. To compensate for the manufacturing variations and the controller needing to apply different program voltages to program memory cells to a same logic state, solutions can perform a calibration process. For example, the non-volatile memory device can calibrate a program voltage to be applied to a segment of the non-volatile memory device to program the memory cells to a respective logic state.

In one example, the calibration process can include applying a predetermined initial voltage (e.g., a start voltage) first and then verifying how many memory cells, if any, were programmed to a first logic state as a result of applying the voltage. In some embodiments, the non-volatile memory device can then proceed to increment the initial voltage by a predetermined amount (e.g., by a predetermined voltage step size), apply the updated incremented voltage, and verify how many memory cells, if any were programmed to the first logic state. The non-volatile memory device can continue this process until memory cells are programmed to a respective desired state. For example, in a single-level cell system, the non-volatile memory device can continue incrementing the voltage until determining a program voltage causes half the memory cells to be programmed to the first logic state. Accordingly, the non-volatile memory device can determine a voltage to apply to memory cells during a program operation for each segment (e.g., block or deck as described with reference to FIG. 3). In some solutions, the calibration process can also include or be referred to as resampling—e.g., if memory cells are not programmed to a desired state within a predetermined number of calibration steps, the non-volatile memory device can perform a resampling process and recalibrate the voltage applied to the memory cells. In one example, a non-volatile memory device can perform the resampling or calibration process on a first write of a new segment or when transitioning from an upper deck to a lower deck as described with reference to FIG. 3.

In some solutions, the non-volatile memory device resets to the initial voltage each time a calibration process or resampling process is performed for a new segment. However, starting from the initial voltage each time can prolong a time it takes to program the memory cells—e.g., the initial voltage can be low enough that it may take several voltage step sizes before a program voltage is determined for the segment. This can cause the non-volatile memory device to perform additional calibration steps (e.g., calibration loops), increasing the latency of the program operation. Applying the additional voltage pulses can also consume additional energy and affect the overall performance of the non-volatile memory device during the program operation.

Aspects of the present disclosure address the above and other deficiencies by utilizing a determined program voltage for a first segment of the non-volatile memory device when calibrating a second segment of the non-volatile memory device. For example, the non-volatile memory device can perform the calibration process as described above for a first write on-die (e.g., on the non-volatile memory device) and determine a program voltage for a first segment. After a successful calibration, a local media controller of the non-volatile memory device can store the determined program voltage of the first segment and an offset value—e.g., a value to offset the determine program voltage by when performing the calibration at a next segment (e.g., a second segment). For example, the local media controller can store an offset value that is a multiple of the predetermined voltage size step—e.g., two (2) times the predetermined voltage step size, three (3) times the predetermined voltage step size, one half (½) times the predetermined voltage step size, etc. Using the stored values, the local media controller can begin a calibration process for a second segment at a program voltage that is a difference of the determined program voltage for the first segment and the offset value; calibrated program voltage of first segment–offset value=initial program voltage during calibration of a second segment. Accordingly, the local media controller can begin the calibration of the program voltage for the second segment at a value greater than the initial program voltage applied for the first segment.

The advantages of this approach include, but are not limited to, improved performance in the non-volatile memory device. By utilizing the previously determined program voltage for the segment, the non-volatile memory device can reduce a number of times of a program voltage is applied during the calibration process—e.g., the local media controller can start the calibration for the second segment at a higher voltage magnitude and refrain from starting from the initial program voltage each time. Additionally, by utilizing the offset value, the local media controller can still compensate for the variations in the manufacturing process—e.g., the local media controller can start from a voltage smaller than the program voltage determined for the first segment in case the second segment requires a lower program voltage due to the manufacturing deviations. Utilizing the previously determined program voltage and offset can enable the non-volatile memory device to reduce program times and improve the overall performance of the system—e.g., all sub-blocks of the non-volatile memory device can have a similar average programming time and the methods and systems described herein can reduce variation amongst sub-blocks.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include not- and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, local media controller 135 can include a voltage calibration component 113. In at least one embodiment, the voltage calibration component 113 can perform a calibration process to determine a program voltage to apply to respective segments or portions of memory array 104. In some embodiments, the voltage calibration component 113 can perform a resampling calibration process when writing to a segment for a first time—e.g., start a calibration process from an initial predetermined voltage when writing to a first page of a first segment for a first time. For example, the voltage calibration component 113 can cause a first program voltage having a first magnitude to be applied. The voltage calibration component 113 (e.g., or the local media controller 135 or memory sub-system controller 115) can then verify how many memory cells were programmed to a desired logic state after applying the first program voltage. In at least one embodiment, the voltage calibration component 113 can determine the number of memory cells programmed to the desired logic state is below a threshold value (e.g., one half). In such embodiments, the voltage calibration component 113 can increment the magnitude of the first program voltage by a predetermined step size to determine a second program voltage. In at least one embodiment, the voltage calibration component 113 can apply the second program voltage having the second magnitude to the memory cells. In some embodiments, the voltage calibration component 113 can then verify again if a number of memory cells programmed to the desired logic state satisfy the threshold value. If the voltage calibration component 113 determines the threshold value is satisfied, voltage calibration component 113 can refrain from applying additional program voltages to the memory cells—e.g., the program operation can be complete for the selected memory cells. In other embodiments, the voltage calibration component 113 can determine a number of memory cells programmed to the desired logic state does not satisfy the threshold value. In such embodiments, the voltage calibration component 113 can continue to increment the program voltage and perform a check until the number of memory cells programmed to the desired logic state satisfy the threshold value.

In at least one embodiment, the voltage calibration component 113 can store the final program voltage applied to the memory cells of the first segment—e.g., store the final program voltage that caused the number of memory cells programmed to the desired logic state to satisfy the threshold value. In at least one embodiment, the voltage calibration component 113 can also store an offset value. In one embodiment, the offset value is a multiple of the predetermined step size—e.g., one half the predetermined step size, two (2) times the predetermined step size, three (3) times the predetermined step size, etc. In at least one embodiment, the voltage calibration component 113 can utilize the stored final program voltage and the offset value to determine an initial program voltage to calibrate a second segment of the memory array 104—e.g., determining the initial program voltage when performing the program operation for a first time on the second segment. In one embodiment, the voltage calibration component 113 can take a difference between the final program voltage applied to the memory cells of the first segment and the offset value to determine the initial program voltage to be applied to the second segment. By utilizing the stored final program voltage and the offset, the voltage calibration component 113 can reduce a number of program pules applied during the calibration process for the second time. In at least one embodiment, this can reduce the overall programming time for the memory device 130.

In some embodiments, the memory sub-system controller 115 includes at least a portion of voltage calibration component 113. In some embodiments, voltage calibration component 113 is part of the host system 110, an application, or an operating system. In other embodiment, local media controller 135 includes at least a portion of voltage application component 113 and is configured to perform the functionality described herein. In such an embodiment, voltage calibration component 113 can be implemented using hardware or as firmware, stored on memory device 130, executed by the control logic (e.g., voltage calibration component 113) to perform the operations related to a program operation described herein.

Figure 1B:
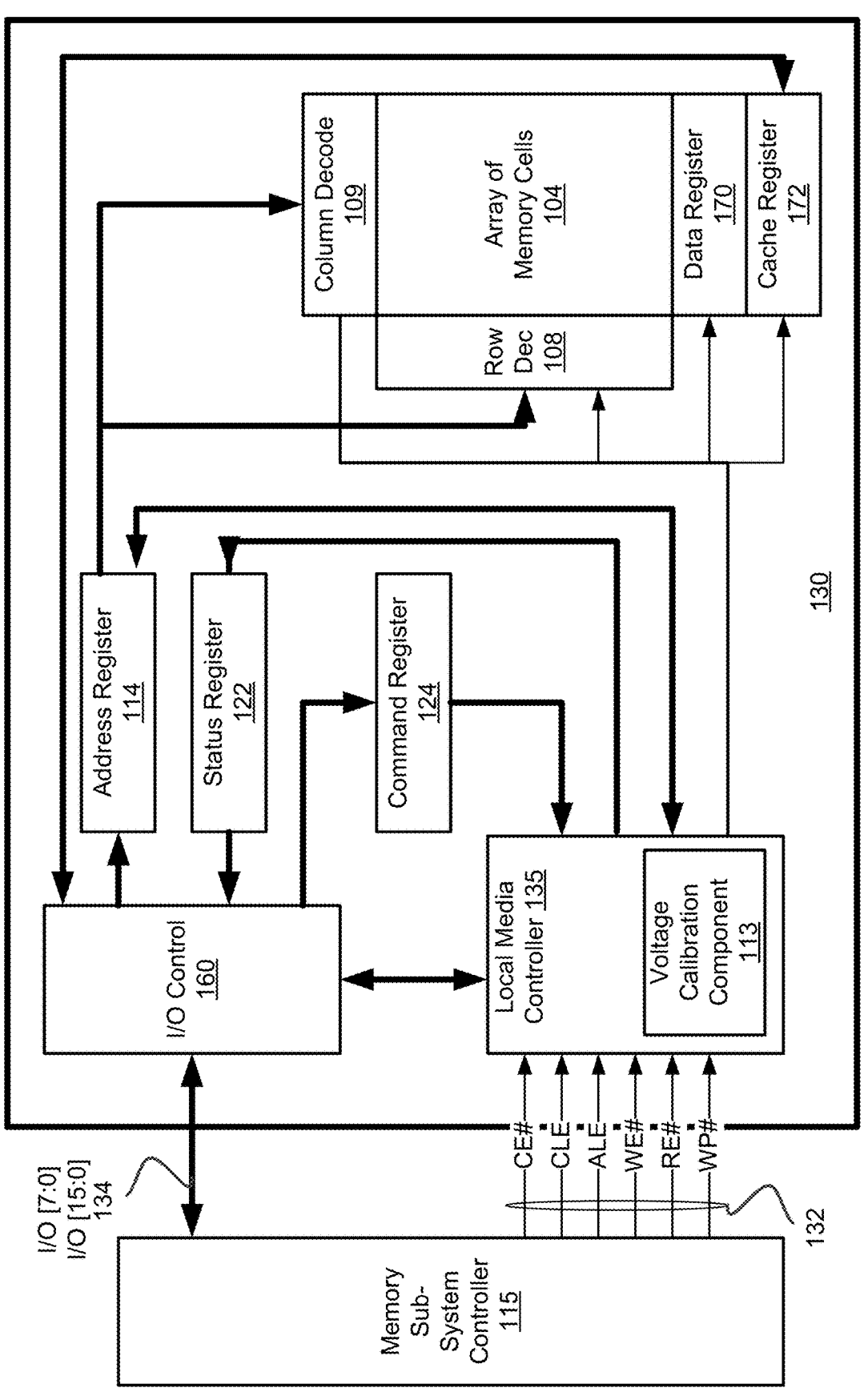
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device. The local media controller 135 can include the voltage calibration component 113.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states. In one embodiment, the array of memory cells 104 (i.e., a "memory array") can include a number of sacrificial memory cells used to detect the occurrence of read disturb in memory device 130, as described in detail herein.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 160 and may then be written into command register 124. The addresses may be received over input/output (I/O) pins [7:0] of I/O bus 236 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
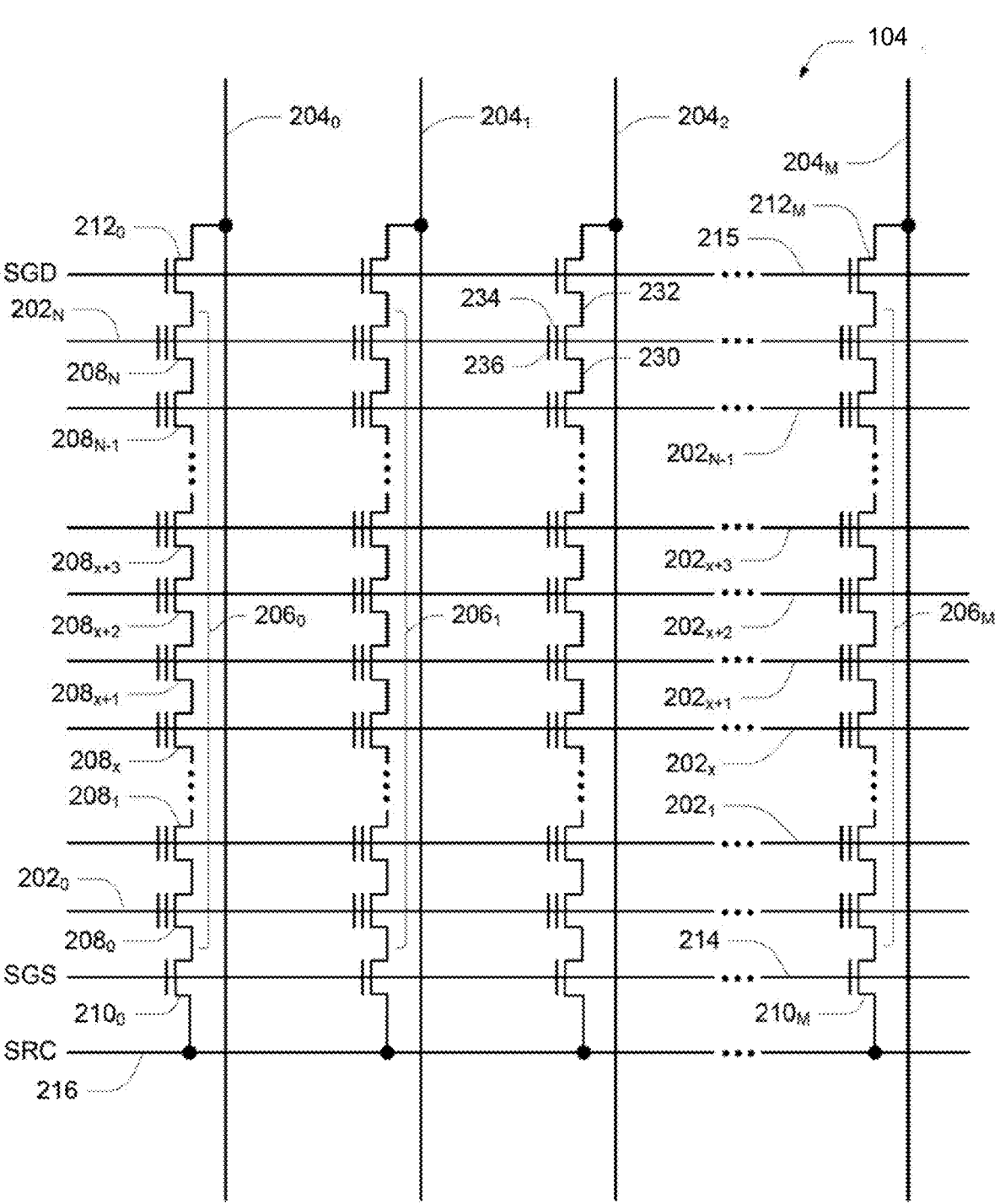
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells or replacement gate (RG) NAND memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

In one embodiment, one or more of NAND strings 206 can be designated as sacrificial strings and used to detect read disturb in memory array 104. For example, NAND string $206_0$ can be designated a sacrificial string. In other embodiments, there can be different NAND strings or additional NAND strings, including two or more NAND strings, which are designated as sacrificial strings. In one embodiment, NAND string $206_0$ can include at least one sacrificial memory cell 208 from each wordline 202. These sacrificial memory cells 208 in the sacrificial memory string $206_0$ are not made available to the memory sub-system controller, and thus are not used to store host data. Rather, the sacrificial memory cells 208 remain in a default state (e.g., an erased state) or are programmed to a known voltage (e.g., a voltage corresponding to a known state). When a read operation is performed on any of the wordlines in memory array 104, a read voltage is applied to the selected wordline and a pass voltage is applied to the unselected wordlines, and the sacrificial memory cells will experience the same read disturb effects as the memory cells storing host data. When the read disturb effects become strong enough, one or more of the sacrificial memory cells can shift from the default or known state to a different state (e.g., to a state associated with a higher voltage level). Thus, local media controller 135 can perform a string sensing operation on the string of sacrificial memory cells to determine whether read disturb has occurred. In one embodiment, to perform the string sensing operation a predefined read voltage is applied to each wordline 202 concurrently, and the current through the sacrificial string $206_0$ is sensed. If any of the sacrificial memory cells 208 in the sacrificial string $206_0$ has shifted to a different state, the sacrificial string $206_0$ will not conduct and current will not flow. Thus, in such a situation, local media controller 135 can determine that read disturb is present in the block of memory array 104.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings

206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
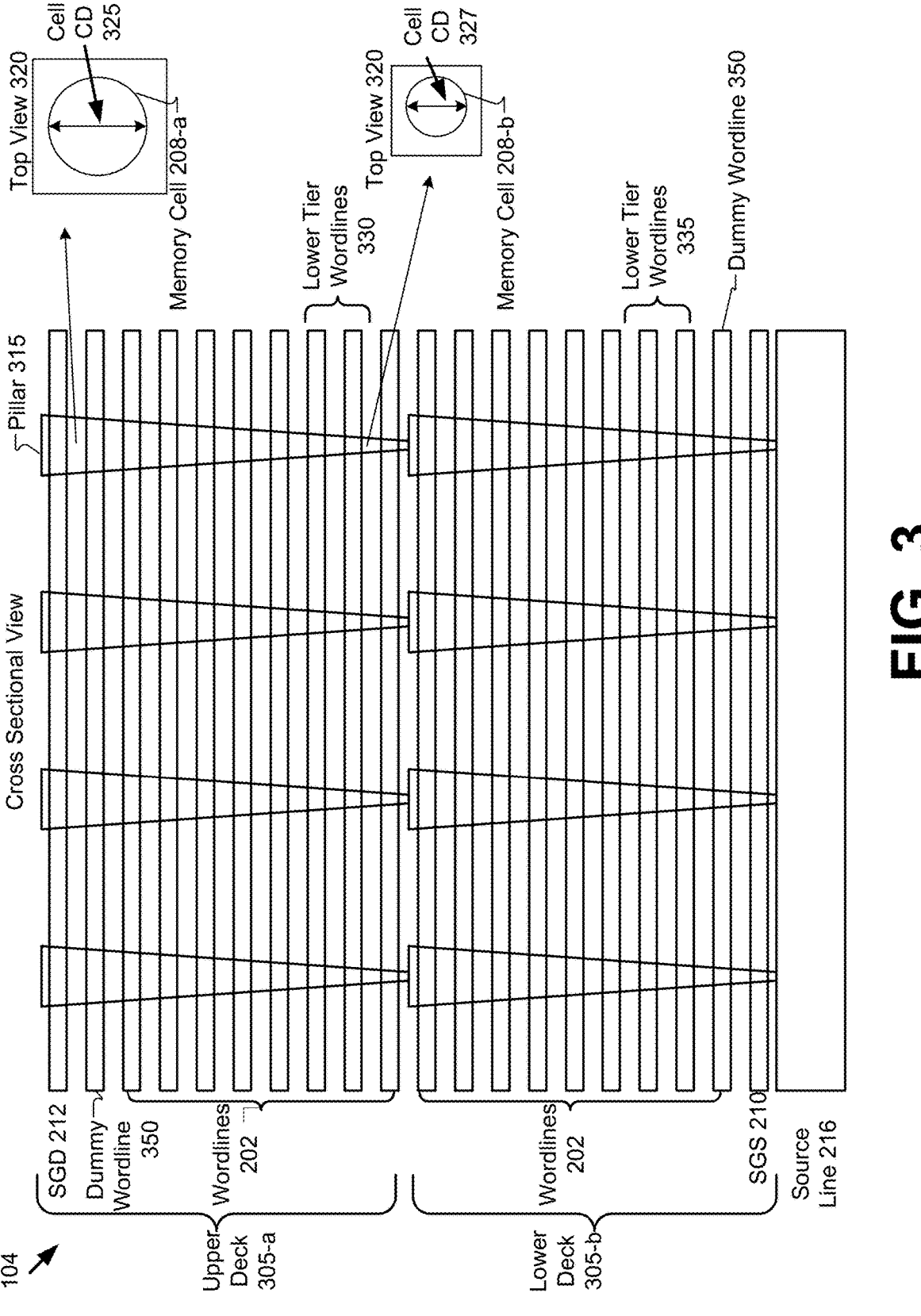
FIG. 3 is an illustration of an array of memory cells as could be used in a memory of the type described with reference to FIG. 1B in accordance with some embodiments of the present disclosure.

FIG. 3 is a schematic of portions of an array of memory cells 104, such as a NAND memory array, as could be used in a memory of the type described with reference to FIG. 1B according to an embodiment. Memory array 104 includes an upper deck **305-*a* including wordlines 202 as described with reference to FIG. 2 and a lower deck 305-*b* including wordlines 202 as described with reference to FIG. 2. In at least one embodiment, a deck 305 (e.g., a layer) can refer to a layer of memory cells or an array of memory cells 104. In such embodiments, array or layers of memory cells can be stacked on top of one another to form a three-dimensional array—e.g., multiple decks 305 can be stacked on top of one another to form the three-dimensional. Accordingly, upper deck 305-*a* can include wordlines 202 associated with a first deck that is stacked on top of a second deck (e.g., a lower deck 305-*b*) of wordlines 202. The upper or lower deck 305 can be an example of the array of memory cells 104 described with reference to FIG. 2. FIG. 3 can further illustrate a select gate drain (SGD) 212, select gate source (SGS) 210, and source line 216 as described with reference to FIG. 2. FIG. 3 illustrates a cross sectional view of wordlines and pillars 315 (e.g., a vertical conductive trace) extending from a shared bit line—e.g., each pillar 315 can represent a vertical NAND string 206 as described with reference to FIG. 2. Accordingly, each pillar 315 can include a memory cell 208 at an intersection with a wordline 305 or wordline 310**.

In at least one embodiment, each deck 305 can include memory cells 208 having varying dimensions. For example, pillar 315 can be formed in cone like shape, where the pillar 315 is wider towards the top and narrower towards the bottom—e.g., the pillar 315 width can decrease as the pillar 315 descends vertically down the deck 305. The varying pillar 315 width can cause memory cells 208 towards the top of the pillar (e.g., towards the top of the pillar 315 in a vertical direction) to have a larger cell critical dimension (CD) 325 than memory cells 208 towards the bottom of the pillar 315 (e.g., towards the bottom of the pillar 315 in the vertical direction). In one embodiment, top view 320 illustrates a memory cell **208-*a* having a cell CD 325 larger than a memory cell 208-*b* lower in the pillar 315 having a cell CD 327—e.g., the memory cell 208-*a* is wider and larger than memory cell 208-*b*. Accordingly, memory cell 208-*b* can have different dielectric characteristics and different read disturb or read window budget (RWB) properties compared with memory cell 208-*a*. In one embodiment, due to the different dielectric characteristics, memory cell 208-*a* can be applied with a different program voltage than memory cell 208-*b*** when being programmed to a same logic state.

In one embodiment, due to the pillar like shape, the local media controller (e.g., or voltage calibration component 113) can begin with a resampling process when writing a first page of either upper deck **305-*a* or lower deck 305-*b* during a program operation. In such embodiments, the local media controller can cause a predetermined initial program voltage to be applied to the memory cells first. In at least one embodiment, the local media controller can then perform a verification operation to determine a number of memory cells programmed to a first logic state. If the local media controller operation determines the number of memory cells programmed to the first logic state is below a threshold value, the local media controller can increment the program voltage by a predetermined step size and perform a second verification operation. The local media controller can then repeat the process described herein until a number of memory cells programmed to the first logic state satisfy the threshold value. In at least one embodiment, the local media controller can store a value associated with the program voltage that caused the number of memory cells programmed to the first logic state to satisfy the threshold value. The local media controller can also store an offset value that is a multiple of the predetermined step size. Accordingly, when the local media controller performs a resampling process (e.g., the calibration process for a first time) on a second segment (e.g., either the remaining upper deck 305-*a* or lower deck 305-*b*** depending on which is programmed first), the local media controller can start the calibration process at a program voltage that is a difference between the stored program voltage and the offset value. This can enable the local media controller to start at a higher program voltage than the predetermined initial program voltage and reduce a total number of pulses applied during the calibration process.

FIG. 4 is a flow diagram of an example method of utilizing a previously stored resample start voltage for calibration in a program operation, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by local media controller 135 or voltage calibration component 113 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, a program operation is initiated on a first segment of a memory device. For example, the processing logic (e.g., voltage calibration component 113) causes a program operation to be initiated on the first segment of the memory device. In at least one embodiment, the first segment can be a first page within a deck (e.g., within upper or lower deck 305 as described with reference to FIG. 3). In at least one embodiment, the first segment is a first page within a block or sub-block. In one embodiment, the processing logic can initiate the program operation on the first segment for a first time—e.g., the processing logic can write to the first segment for the first time—e.g., a first time after initialization or block erasure.

At operation 410, a calibration process is performed and a program voltage for the first segment is determined. For example, the processing logic causes the calibration process to be performed at the first segment. In such embodiments, the processing logic can determine a program voltage for the first segment and store the determined program voltage in a register—e.g., a register within voltage calibration component 113, a register within local media controller 113, or a register within memory device 130 as described with reference to FIG. 1A. In at least one embodiment, to perform the calibration process at the first segment, the processing logic causes an initial program voltage to be applied to memory cells of the first segment. In at least one embodiment, the processing logic can then verify the program pulse and determine a number of memory cells, if any, programmed to a first and/or second logic state. In at least one embodiment, the processing logic can compare a number of memory cells programmed to the first or second logic state with a threshold value. If the processing logic determines the number of memory cells programmed to the first logic state satisfies the threshold value, the processing logic can complete the program operation and store the corresponding program voltage applied (e.g., the initial program voltage). In other embodiments, if the processing logic determines the number of memory cells programmed to the first logic state fails to satisfy the threshold value, the processing logic can increment the initial program voltage by a predetermined step size to determine a second program voltage—e.g., a step size programmed within the memory device 130 or provided by host system 120. Accordingly, the processing logic can apply the second program voltage and perform a second verification operation—e.g., determine if a number of memory cells programmed to the first logic state satisfies the threshold value after the second program voltage is applied. If the processing logic determines the number of memory cells programmed to the first logic state satisfies the threshold value after the application of the second program voltage, the processing logic can complete the program operation and store the corresponding program voltage applied (e.g., the second program voltage). If the processing logic determines the number of memory cells programmed to the first logic state fails to satisfy the threshold value, the processing logic can increment the second program voltage by the predetermined threshold size to determine a third program voltage. In some embodiments, the processing logic can then apply the third voltage and perform another verification operation. In at least on embodiment, the processing logic can repeat the steps described with reference to operation 410 until a number of memory cells programmed to the first logic state satisfy the threshold value and store the corresponding program voltage—e.g., store the program voltage value that caused the number of memory cells programmed to the first logic state to satisfy the threshold value. It should be noted, the processing logic can refrain from storing a program voltage if either the calibration process or resampling process fails—e.g., the processing logic can be programmed to store a program voltage upon a successful completion of a calibration or resampling process. In some embodiments, the processing logic can update a program voltage stored at the register—e.g., update the program voltage from a first value to a second value responsive to completing a successful calibration process on a second segment of the memory device utilizing the program voltage having the second value.

In at least one embodiment, the processing logic can also store an offset value. In one embodiment, the offset value can be a predetermined multiple of the voltage step size—e.g., the offset value can be two (2) times the voltage size step, three (3) times the voltage step size, one half (½) times the voltage size step, etc. In one embodiment, the offset value can be determined based on a desired program time. That is a lower offset value can correlate to a smaller program time—e.g., a smaller offset from the stored program voltage can reduce a number of voltage step sizes needed to equal or exceed the stored program voltage.

At operation 415, a program operation (e.g., a second program operation or a second stage of the program operation initiated at operation 405) is initiated on a second segment of a memory device. For example, the processing logic (e.g., voltage calibration component 113) causes a program operation to be initiated on the second segment of the memory device. In at least one embodiment, the second segment can be a first page within a second deck (e.g., within a remaining upper or lower deck 305 as described with reference to FIG. 3). In at least one embodiment, the second segment is a first page within a second block or second sub-block. In one embodiment, the processing logic can initiate the program operation on the second segment for a first time—e.g., the processing logic can write to the second segment for the first time—e.g., a first time after initialization or block erasure.

At operation 420, a first stored value corresponding to a determined program voltage for the first segment is read from a register. For example, the processing logic causes the previously stored determined program voltage to be read from the register. In at least one embodiment, the register can be a table storing the program voltage and/or the offset voltage. In one embodiment, the register can store information as represented by or corresponding to Table 1.

TABLE 1

| Trim Name | Trimbit | Analog | Purpose |
|---|---|---|---|
| Sampling Enabled | 1 bit | Enable | Enable/Disable trim for feature |
| Previous Sampling Voltage | 8 bits | "X" Voltage | Storage of the previously applied program voltage, with a 10 bit resolution |
| Sampling Offset Value | 8 bits | Factor of Voltage Step Size | Indicate the offset from the previous sampling voltage with a 10 bit resolution |

As illustrated in Table 1, the register can store a bit that indicates whether to utilize a previously applied program voltage to a first segment of the memory device. For example, the processing logic can read the register and the sampling enabled value. If the processing logic determines the bit has a first value (e.g., '1'), the processing logic can use the previous sampling voltage stored. In other embodiments, the processing logic can determine the bit has a second value (e.g., '0') and can refrain from using a previous sampling voltage stored, if any—e.g., the processing logic can perform the calibration process by starting from an initial predetermined voltage. In at least one embodiment, the processing logic can write a value for the sampling enabled bit based on an endurance of memory. For example, the processing logic can write a first value (e.g., '1') indicating to utilize the previously stored value if memory cells have a low endurance (e.g., memory cells with relatively short program times). In other examples, the processing logic can write a second value (e.g., '0') indicating to not utilize a previous sample voltage and start from the predetermined initial program voltage. In at least one embodiment, the processing logic can read a value '0' for the previous sampling voltage value. In such embodiments, there may not have been a previous program or write operation—e.g., a value '0' can indicate there is no stored program voltage yet. In some embodiments, the value can be a '0' after chip initialization—e.g., after the memory device is initialized.

At operation 425, a second stored value corresponding to an offset for the determined program voltage of the first segment is read from a register. For example, the processing logic causes the offset value associated with the determined program voltage of the first segment voltage to be read from the register. In at least one embodiment, the processing logic can read the second stored value responsive to reading the first stored value. For example, the processing logic can read the second stored value if the stored program voltage has a value other than '0.' That is, if the processing logic determines there is no previous sample voltage, the processing logic can refrain from reading the second stored value. In one embodiment, the offset value is a multiple of the voltage step size during the calibration process—e.g., two (2) times the predetermined voltage size step, three (3) times the predetermined voltage, one half (½) times the predetermined voltage size step, etc. In at least one embodiment, a size of the offset value can be based on a desired program time or calibration accuracy. For example, a smaller offset value can reduce an overall program time while a larger offset value can increase the accuracy of the calibration process—e.g., the smaller offset value can enable fewer program voltages to be applied during calibration while the larger offset value can increase the number of program voltages applied for increased reliability.

At operation 430, a second program voltage for a second calibration process at the second segment is determined. For example, processing logic calculates a second program voltage for the second calibration process at the second segment. In at least one embodiment, the processing logic can determine an initial program voltage (e.g., the second program voltage) for the second calibration process by utilizing the stored first and second values. In one embodiment, the processing logic can determine the second program voltage by taking a difference between the first stored value and the second stored value—e.g., first stored value–second stored value.

At operation 435, the second program voltage is applied to the second segment. For example, the processing logic causes the second program voltage to be applied to the second segment. In at least one embodiment, the processing logic can start a calibration process for the second segment by applying the second program voltage. The processing logic can then verify the second program voltage and determine a number of memory cells, if any, programmed to a first and/or second logic state in the second segment. In at least one embodiment, the processing logic can compare a number of memory cells programmed to the first or second logic state with a threshold value. If the processing logic determines the number of memory cells programmed to the first logic state satisfies the threshold value, the processing logic can complete the program operation and store the corresponding program voltage applied (e.g., the second program voltage). In other embodiments, if the processing logic determines the number of memory cells programmed to the first logic state fails to satisfy the threshold value, the processing logic can increment the initial program voltage by the predetermined step size to determine a third program voltage—e.g., a step size programmed within the memory device 130 or provided by host system 120. Subsequently, the processing logic can follow the steps as described with reference to operation 410 until the number of memory cells programmed to the first logic state satisfy the threshold value. By starting at the higher second program voltage, the processing logic can reduce a number of program voltages applied during the second calibration process compared to the number of program voltages applied during the first calibration process.

FIG. 5 is a flow diagram of an example method of utilizing a previously stored resample start voltage for calibration in a program operation, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by local media controller 135 or voltage calibration component 113 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, a program operation is initiated on one or more memory cells of a first segment of the memory array, where the program operation includes a first calibration phase. For example, the processing logic (e.g., voltage calibration component 113) causes a program operation to be initiated on the one or more memory cells of the first segment. As described with reference to FIG. 4, in some embodiments, the processing logic can perform a calibration process to determine a program voltage sufficient to program memory cells to a desired logic state. In at least one embodiment, the processing logic can perform the first calibration phase when performing a program operation for a first time on a respective memory segment—e.g., the processing logic can perform the calibration process after the memory device is initialized. In one embodiment, the memory array can include a plurality of memory cells arranged in at least the first segment and a second segment. In one embodiment, the first segment is associated with a first block of memory cells or a first tier of memory cells. In at least one embodiment, the second segment is associated with a second block of memory cells or a second tier of memory cells.

At operation 510, a first stored value corresponding to a first voltage applied during a second calibration phase for a second memory segment is read, where the second calibration phase occurs before the first calibration phase. For example, the processing logic reads the first stored value. In at least one embodiment, the first stored value is a final voltage (e.g., a calibrated program voltage) applied at the second segment—e.g., applying the first voltage can cause a desired number of memory cells to be programmed to a target logic state for the second segment of memory cells. That is, the first voltage can be the voltage determined as a result of operation 410 as described with reference to FIG. 4. In at least on embodiment, the processing logic can read a third stored value before reading the first stored value. In one embodiment, the processing logic can determine the third stored value indicates to use the first stored value— e.g., the processing logic reads the first stored value responsive to determining the third stored value indicates to use the first stored value. In at least one embodiment, the third stored value can be the "sampling enabled" value as described with reference to FIG. 4. In other embodiments, the control logic can read the third stored value and determine the third stored value indicates to not use the first stored value. In such embodiments, the processing logic can refrain from utilizing the first stored value and initiate the calibration process at a third voltage (e.g., a predetermined initial voltage as described with reference to FIG. 4). In one embodiment, the processing logic can determine the first stored value is '0.' In such embodiments, the processing logic can utilize the predetermined initial voltage. That is, the first stored value being '0' can indicate that there was no previous calibration process done and the processing logic should accordingly start with the predetermined initial voltage.

At operation 515, a second stored value corresponding to an offset value associated with the first voltage is read. For example, the processing logic reads the second stored value. In at least one embodiment, the offset value corresponds to a predetermined voltage step size for the calibration process as described with reference to FIG. 4—e.g., the offset value can be a multiple of the predetermined step size. For example, the offset value can be two (2) times the predetermined voltage step size, three (3) times the predetermined voltage step size, one half (½) times the predetermined voltage step size, etc. In at least one embodiment, the offset value can be based on a target program time as described with reference to FIG. 4.

At operation 520, a second voltage for application during the calibration phase is determined. For example, the processing logic can determine the second voltage responsive to reading the first stored value and the second stored value. In at least one embodiment, the second voltage is an initial voltage applied during the first calibration phase. In at least one embodiment, the processing logic is to determine a difference between the first stored value and the second stored value to determine the second voltage. In one embodiment, the processing logic can cause the second voltage to be applied to the one or more memory cells of the first segment.

In at least one embodiment, processing logic can determine a number of memory cells programmed to a first logic state responsive to causing the second voltage to be applied—e.g., the processing logic can verify the second voltage as described with reference to FIG. 4. In one embodiment, the processing logic can determine the number of memory cells programmed to the first logic state fail to satisfy a threshold value. In such embodiments, the processing logic can continue the first calibration phase. For example, the processing logic can increment the second voltage by a predetermined step size to calculate a third voltage responsive to determining the number of memory cells failing to satisfy the threshold value and cause the third voltage to be applied to the one or more memory cells of the first segment. In at least one embodiment, the processing logic can verify the third voltage and continue the process of incrementing the voltage applied until the number of memory cells programmed to the first logic state satisfy the threshold value. In other embodiments, the processing logic can determine the number of memory cells programmed to the first logic state satisfy a threshold value after applying the second program voltage. In such embodiments, the processing logic can update the first stored value to a third stored value corresponding to the second voltage—e.g., the processing logic can write the most recent voltage value to a register of the memory device after successfully completing the calibration phase.

Figure 6:
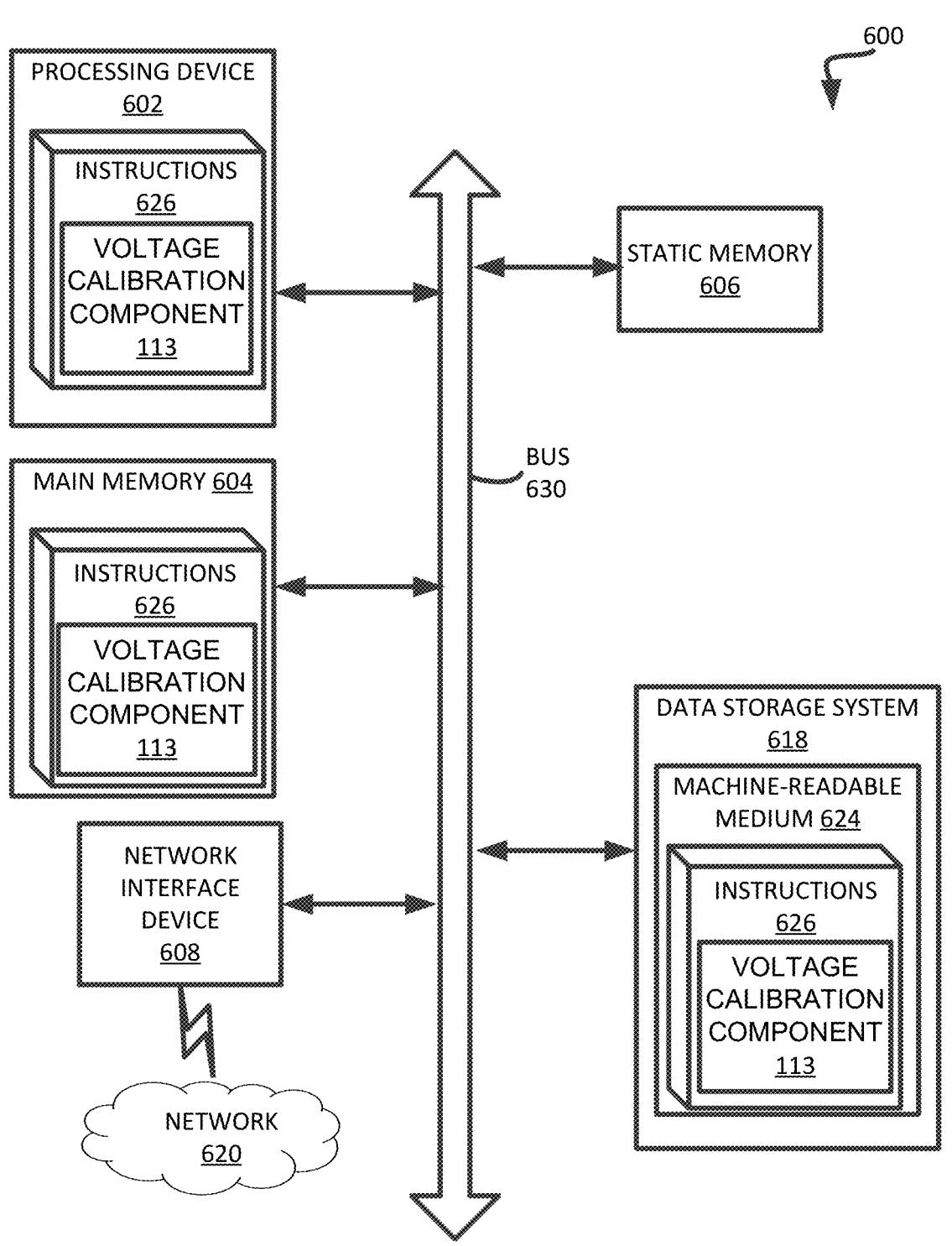
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the voltage calibration component 113 of FIG. 1 to perform a calibration process during a program operation). In at least one embodiment, the voltage calibration component 113 is configured determine a first program voltage for a first segment and store the first program voltage. The voltage calibration component 113 can then utilize the stored calibration value (e.g., subtract a stored offset value from the stored first program voltage) to determine an initial program voltage for a calibration at a second segment as described with respect to FIGS. 1-5. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a voltage application component 113 to perform a read operation for the processing device 602. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising a plurality of memory cells arranged in at least a first segment and a second segment; and
   control logic, operatively coupled with memory array, to:
      initiate a current program operation on one or more memory cells of the first segment of the memory array, wherein the current program operation comprises a current calibration phase for the first segment of the memory array;
      read a first stored value corresponding to a first voltage applied during a previous calibration phase of a previous program operation for the second segment of the memory array, wherein the previous calibration phase is occurred before the current calibration phase;
      read a second stored value corresponding to an offset value associated with the first voltage; and
      determine, during the current calibration phase, a second voltage for application to the first segment responsive to reading the first stored value and the second stored value.

2. The memory device of claim 1, wherein to determine the second voltage, the control logic is further to:
   determine a difference between the first stored value and the second stored value.

3. The memory device of claim 1, wherein the offset value corresponds to a predetermined voltage step size for the previous calibration phase.

4. The memory device of claim 1, wherein the control logic is further to:
   cause the second voltage to be applied to the one or more memory cells of the first segment; and
   determine a number of memory cells programmed to a first logic state responsive to causing the second voltage to be applied.

5. The memory device of claim 4, wherein the control logic is further to:

determine the number of memory cells programmed to the first logic state fail to satisfy a threshold value;

increment the second voltage by a predetermined step size to calculate a third voltage responsive to determining the number of memory cells failing to satisfy the threshold value; and cause the third voltage to be applied to the one or more memory cells of the first segment.

6. The memory device of claim 4, wherein the control logic is further to:

determine the number of memory cells programmed to the first logic state satisfy a threshold value; and update the first stored value to a third stored value corresponding to the second voltage.

7. The memory device of claim 1, wherein the control logic is further to:

read a third stored value; and determine the third stored value indicates to use the first stored value, wherein the control logic is to read the first stored value responsive to determining the third stored value indicates to use the first stored value.

8. The memory device of claim 1, wherein:

the first segment is associated with a first block of memory cells or a first tier of memory cells; and the second segment is associated with a second block of memory cells or a second tier of memory cells.

9. A method, comprising:

initiating a current program operation on one or more memory cells of a first segment of a memory array, wherein the current program operation comprises a current calibration phase;

reading a first stored value corresponding to a first voltage applied during a previous calibration phase of a previous program operation for a second segment of the memory array, wherein the previous calibration phase occurred before the current calibration phase;

reading a second stored value corresponding to an offset value associated with the first voltage; and determining, during the current calibration phase, a second voltage for application to the first segment responsive to reading the first stored value and the second stored value.

10. The method of claim 9, further comprising:

determining a difference between the first stored value and the second stored value, wherein determining the second voltage is responsive to determining the difference.

11. The method of claim 9, wherein the offset value corresponds to a predetermined voltage step size for the previous calibration phase.

12. The method of claim 9, further comprising:

causing the second voltage to be applied to the one or more memory cells of the first segment; and determining a number of memory cells programmed to a first logic state responsive to causing the second voltage to be applied.

13. The method of claim 12, further comprising:

determining the number of memory cells programmed to the first logic state fail to satisfy a threshold value;

incrementing the second voltage by a predetermined step size to calculate a third voltage responsive to determining the number of memory cells failing to satisfy the threshold value; and causing the third voltage to be applied to the one or more memory cells of the first segment.

14. The method of claim 12, further comprising:

determining the number of memory cells programmed to the first logic state satisfy a threshold value; and updating the first stored value to a third stored value corresponding to the second voltage.

15. The method of claim 9, further comprising:

reading a third stored value; and determining the third stored value indicates to use the first stored value, wherein reading the first stored value is responsive to determining the third stored value indicates to use the first stored value.

16. A non-transitory computer-readable medium storing instructions thereon, wherein the instructions, when executed by a processing device, cause the processing device to:

initiate a current program operation on one or more memory cells of a first segment of a memory array, wherein the current program operation comprises a current calibration phase;

read a first stored value corresponding to a first voltage applied during a previous calibration phase of a previous program operation for a second segment of the memory array, wherein the previous calibration phase occurred before the current calibration phase;

read a second stored value corresponding to an offset value associated with the first voltage; and determine, during the current calibration phase, a second voltage for application to the first segment responsive to reading the first stored value and the second stored value.

17. The non-transitory computer-readable medium of claim 16, wherein to determine the second voltage, the processing device is further to:

determine a difference between the first stored value and the second stored value.

18. The non-transitory computer-readable medium of claim 16, wherein the offset value corresponds to a predetermined voltage step size for the previous calibration phase.

19. The non-transitory computer-readable medium of claim 16, wherein the processing device is further to:

cause the second voltage to be applied to the one or more memory cells of the first segment; and determine a number of memory cells programmed to a first logic state responsive to causing the second voltage to be applied.

20. The non-transitory computer-readable medium of claim 19, wherein the processing device is further to:

determine the number of memory cells programmed to the first logic state fail to satisfy a threshold value;

increment the second voltage by a predetermined step size to calculate a third voltage responsive to determining the number of memory cells failing to satisfy the threshold value; and cause the third voltage to be applied to the one or more memory cells of the first segment.

* * * * *